United States Patent
Hars

(10) Patent No.: US 10,469,059 B1
(45) Date of Patent: Nov. 5, 2019

(54) STABILIZING THE STARTUP BEHAVIOR OF RING OSCILLATORS

(71) Applicant: THE BOEING COMPANY, Chicago, IL (US)

(72) Inventor: Laszlo Hars, Lafayette, CO (US)

(73) Assignee: The Boeing Company, Chicago, IL (US)

(*) Notice: Subject to any disclaimer, the term of this patent is extended or adjusted under 35 U.S.C. 154(b) by 47 days.

(21) Appl. No.: 15/853,152

(22) Filed: Dec. 22, 2017

(51) Int. Cl.
| | | |
|---|---|---|
| H03K 3/03 | (2006.01) | |
| H03L 7/24 | (2006.01) | |
| H03K 3/014 | (2006.01) | |
| H03K 19/20 | (2006.01) | |
| H03K 5/135 | (2006.01) | |
| G06F 1/08 | (2006.01) | |
| H03K 5/00 | (2006.01) | |

(52) U.S. Cl.
CPC .............. *H03K 3/014* (2013.01); *G06F 1/08* (2013.01); *H03K 3/0315* (2013.01); *H03K 3/0322* (2013.01); *H03K 5/135* (2013.01); *H03K 19/20* (2013.01); *H03L 7/24* (2013.01); *H03K 2005/00078* (2013.01); *H03K 2005/00234* (2013.01)

(58) Field of Classification Search
CPC .... H03K 3/014; H03K 3/0315; H03K 3/0322; H03K 5/159; H03K 19/20; H03L 7/24
USPC .......................................................... 331/57
See application file for complete search history.

(56) References Cited

U.S. PATENT DOCUMENTS

| | | | | |
|---|---|---|---|---|
| 4,891,609 A | * | 1/1990 | Eilley | H03K 3/011 |
| | | | | 331/108 A |
| 5,191,301 A | * | 3/1993 | Mullgrav, Jr. | H03K 3/0231 |
| | | | | 331/108 B |
| 5,272,453 A | * | 12/1993 | Traynor | H03K 3/0315 |
| | | | | 331/108 A |
| 5,355,097 A | | 10/1994 | Scott et al. | |
| 9,531,354 B1 | * | 12/2016 | Sim | H03K 3/84 |
| 9,998,128 B2 | * | 6/2018 | Grollitsch | H03L 7/0995 |
| 2004/0070459 A1 | * | 4/2004 | Motoyama | H03K 3/0315 |
| | | | | 331/57 |
| 2004/0189407 A1 | * | 9/2004 | Manna | H03K 3/0315 |
| | | | | 331/57 |

(Continued)

FOREIGN PATENT DOCUMENTS

JP        H10 51276 A     2/1998

OTHER PUBLICATIONS

European Search Report dated Mar. 11, 2019; European Application No. 18213301.7-1206.

*Primary Examiner* — Levi Gannon
(74) *Attorney, Agent, or Firm* — Womble Bond Dickinson (US) LLP

(57) ABSTRACT

A system for providing security in a computer system is provided. The system includes a ring oscillator including a plurality of logic gates connected in a ring configuration. The system also includes logic circuits to start the ring oscillator by a ring-enable signal and a clock signal provided to a clock input of at least one controlled logic gate of the plurality of logic gates. The clock signal controls the at least one controlled logic gate and thereby synchronizes the ring oscillator to the clock signal. The clock signal is provided to the clock input for a predetermined warm-up duration, and thereafter, the logic circuits restart and operate the ring oscillator without the clock signal.

16 Claims, 5 Drawing Sheets

(56) References Cited

U.S. PATENT DOCUMENTS

| | | | |
|---|---|---|---|
| 2009/0222502 A1 | 9/2009 | Ikegami | |
| 2009/0243734 A1* | 10/2009 | Margittai | H03K 3/017 331/57 |
| 2010/0102891 A1* | 4/2010 | Nissar | H03K 3/0315 331/57 |
| 2012/0262240 A1* | 10/2012 | Cremonesi | H03K 3/0315 331/57 |
| 2012/0286883 A1 | 11/2012 | Horel | |
| 2014/0049328 A1* | 2/2014 | Smith | H03K 3/0322 331/57 |
| 2016/0028379 A1* | 1/2016 | Tsubota | H03K 3/012 327/291 |
| 2019/0004562 A1* | 1/2019 | Gupta | G06F 1/08 |

\* cited by examiner

STABILIZING THE STARTUP BEHAVIOR OF RING OSCILLATORS

TECHNOLOGICAL FIELD

The present disclosure relates generally to stabilizing the startup behavior of ring oscillators, in particular, to stabilizing the startup behavior of ring oscillators using synchronizable ring oscillators.

BACKGROUND

Ring oscillators include logic gates or analog amplifiers connected in a loop, that is, in a ring configuration. The output of one element is connected to an input of the next. An odd number of these components invert their input signal. Ring oscillators have many uses in electronics, and they can be used as entropy sources to generate true random numbers used in information security. However, at startup, ring oscillators rapidly change their internal temperatures, which together with circuit noise and environmental effects lead to multiple unpredictable oscillation frequencies. This uncertainty of startup behavior of ring oscillators makes the available entropy unpredictable, and therefore may harm the information security.

One existing solution to stabilize the startup behavior of a ring oscillator is to use a thermostat to stabilize the circuit temperature, which is expensive as this solution requires analog circuits. Another existing solution is to self-warm-up the ring oscillator, which does not ensure predictable startup conditions. A third existing solution is to use dummy circuits to generate heat before the ring oscillator starts, which is inaccurate and does not ensure predictable startup conditions.

Therefore it would be desirable to have a system and method that take into account at least some of the issues discussed above, as well as other possible issues.

BRIEF SUMMARY

Example implementations of the present disclosure are directed to stabilizing the startup behavior of ring oscillators using synchronizable ring oscillators. The synchronizable ring oscillators are built with standard logic gates. The ring oscillators can be synchronized to a stable clock signal at startup during a predetermined warm-up duration. Thus, in contrast to the existing solutions, example implementations can stabilize the startup behavior of ring oscillators with low cost and can provide predictable startup conditions.

The present disclosure thus includes, without limitation, the following example implementations.

Some example implementations provide a method of operating a ring oscillator. The ring oscillator comprises a plurality of logic gates connected in a ring configuration in which an output of each except a last of the plurality of logic gates is used as an input for a next one of the plurality of logic gates, the output of the last of the plurality of logic gates being fed back to and used as an input for a first of the plurality of logic gates. The method comprises starting the ring oscillator by a ring-enable signal (the ring oscillator containing a ring-enable input) and a clock signal provided to a clock input of at least one controlled logic gate of the plurality of logic gates in the ring configuration, the at least one controlled logic gate receiving the clock signal to control the at least one controlled logic gate and thereby synchronize the ring oscillator to the clock signal, the clock signal being provided to the clock input for a predetermined warm-up duration; and thereafter, restarting and operating the ring oscillator without the clock signal.

In some example implementations of the method of any preceding example implementation, or any combination of preceding example implementations, the plurality of logic gates includes an odd number of inverting logic gates connected in the ring configuration, and wherein the at least one controlled logic gate has a synchronizing input that is the clock input to which the clock signal is provided.

In some example implementations of the method of any preceding example implementation, or any combination of preceding example implementations, the at least one controlled logic gate includes a differential buffer gate having a non-inverted input and an inverted input, and at least an inverted output, the non-inverted input being connected to an output of a previous one of the plurality of logic gates in the ring configuration, the inverted input being the clock input, the inverted output being connected to an input for a next one of the plurality of logic gates in the ring configuration, and wherein starting the ring oscillator includes starting the ring oscillator by the ring-enable signal and the clock signal provided to the inverted input of the differential buffer gate.

In some example implementations of the method of any preceding example implementation, or any combination of preceding example implementations, the at least one controlled logic gate includes a tri-state inverter having an input connected to an output of a previous one of the plurality of logic gates in the ring configuration, an inverted output connected to an input of a next one of the inverting logic gates in the ring configuration, and a gate enable input that is the clock input, and wherein starting the ring oscillator includes starting the ring oscillator by the ring-enable signal and the clock signal provided to the enable input of the tri-state inverter.

In some example implementations of the method of any preceding example implementation, or any combination of preceding example implementations, the at least one controlled logic gate includes a gated D-latch having a data input and an enable input, and at least an inverted output, the data input being connected to an output of a previous one of the plurality of logic gates in the ring configuration, the enable input being the clock input, and the inverted output being connected to an input for a next one of the plurality of logic gates in the ring configuration, and wherein starting the ring oscillator includes starting the ring oscillator by the ring-enable signal and the clock signal provided to the enable input of the gated D-latch.

In some example implementations of the method of any preceding example implementation, or any combination of preceding example implementations, the at least one controlled logic gate includes a 2:1 multiplexer connected between consecutive logic gates of the plurality of logic gates in the ring configuration, the 2:1 multiplexer having a first input and a second input, a selector input and an output, the first input being connected to an output of an earlier one of the consecutive logic gates in the ring configuration, the selector input being the clock input, and the output being both connected to an input for a later one of the consecutive logic gates in the ring configuration, and fed back and connected to the second input of the 2:1 multiplexer, and wherein starting the ring oscillator includes starting the ring oscillator by the ring-enable signal and the clock signal provided to the selector input of the 2:1 multiplexer.

In some example implementations of the method of any preceding example implementation, or any combination of preceding example implementations, each of the plurality of logic gates causes a gate delay in signal propagation within the ring oscillator, and starting the ring oscillator includes starting the ring oscillator by the ring-enable signal and the clock signal that includes a periodic train of pulses having a pulse-width that is the gate delay or a multiple of the gate delay.

In some example implementations of the method of any preceding example implementation, or any combination of preceding example implementations, the clock signal has a clock frequency, and restarting and operating the ring oscillator includes restarting and operating the ring oscillator at a frequency that is the clock frequency or a multiple of the clock frequency.

In some example implementations of the method of any preceding example implementation, or any combination of preceding example implementations, the at least one controlled logic gate is multiple controlled logic gates each of which includes a respective clock input that receives the clock signal to control the multiple controlled logic gates and thereby synchronize the ring oscillator to the clock signal.

Some example implementations provide a system for providing security in a computer system, the system comprising one or more logic circuits configured to at least perform the method of any preceding example implementation, or any combination of preceding example implementations.

These and other features, aspects, and advantages of the present disclosure will be apparent from a reading of the following detailed description together with the accompanying drawings, which are briefly described below. The present disclosure includes any combination of two, three, four or more features or elements set forth in this disclosure, regardless of whether such features or elements are expressly combined or otherwise recited in a specific example implementation described herein. This disclosure is intended to be read holistically such that any separable features or elements of the disclosure, in any of its aspects and example implementations, should be viewed as combinable unless the context of the disclosure clearly dictates otherwise.

It will therefore be appreciated that this Brief Summary is provided merely for purposes of summarizing some example implementations so as to provide a basic understanding of some aspects of the disclosure. Accordingly, it will be appreciated that the above described example implementations are merely examples and should not be construed to narrow the scope or spirit of the disclosure in any way. Other example implementations, aspects and advantages will become apparent from the following detailed description taken in conjunction with the accompanying drawings which illustrate, by way of example, the principles of some described example implementations.

BRIEF DESCRIPTION OF THE DRAWING(S)

Having thus described example implementations of the disclosure in general terms, reference will now be made to the accompanying drawings, which are not necessarily drawn to scale, and wherein:

DETAILED DESCRIPTION

Figure 1:
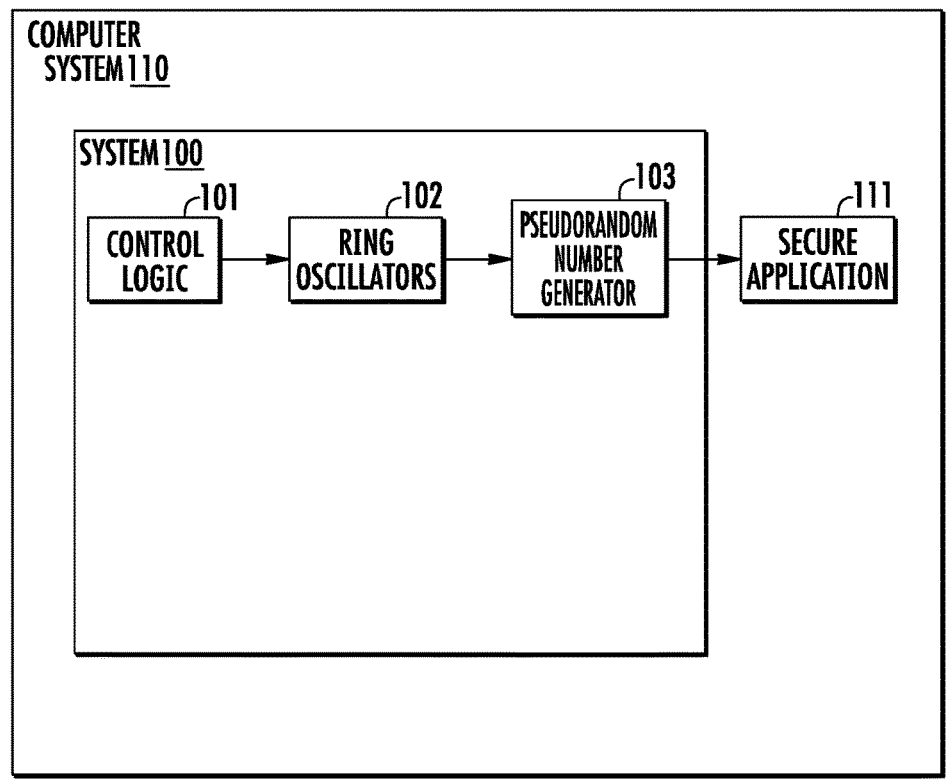
FIG. 1 illustrates a system for providing security in a computer system according to example implementations of the present disclosure.

Some implementations of the present disclosure will now be described more fully hereinafter with reference to the accompanying drawings, in which some, but not all implementations of the disclosure are shown. Indeed, various implementations of the disclosure may be embodied in many different forms and should not be construed as limited to the implementations set forth herein; rather, these example implementations are provided so that this disclosure will be thorough and complete, and will fully convey the scope of the disclosure to those skilled in the art. For example, unless otherwise indicated, reference something as being a first, second or the like should not be construed to imply a particular order. Also, something may be described as being above something else (unless otherwise indicated) may instead be below, and vice versa; and similarly, something described as being to the left of something else may instead be to the right, and vice versa. Like reference numerals refer to like elements throughout.

Example implementations of the present disclosure are generally directed to stabilizing the startup behavior of ring oscillators, in particular, to stabilizing the startup behavior of ring oscillators using synchronizable ring oscillators.

FIG. 1 illustrates a system 100 for providing security in a computer system 110 according to example implementations of the present disclosure. The computer system may include the system as shown. For example, the computer system may be equipped with the system. In another example, the computer system and the system may be two separate systems.

The system 100 may include one or more of each of a number of components, units or the like (generally "components") at least some of which may include or be implemented with logic circuits such as multiplexers, registers, arithmetic logic units, memory, microprocessors and the like. The system may be designed for any of a number of different applications, and may have particular applicability to stabilize the startup behavior of one or more ring oscillators in the system and provide security in the computer system 110.

The computer system 110 may include a processor and a computer-readable storage medium or memory coupled to the processor, where the processor is configured to execute computer-readable program code including one or more computer program stored in the memory. It will also be understood that one or more functions, and combinations of functions, may be implemented by special purpose electronic hardware-based systems and/or processors which perform the specified functions, or combinations of special purpose hardware and program code instructions. As shown, the computer program(s) stored memory and executable by the processor may include a secure application program 111 (also more simply referred to as a secure application).

In some examples, as shown, the system 100 includes a control logic 101 and a ring oscillator 102. The control logic can control the ring oscillator to stabilize the startup behavior of the ring oscillator, as described below. In one example, the ring oscillator can generate and provide true random numbers to a pseudorandom number generator 103 as a seed.

The pseudorandom number generator can use the seed to generate and provide pseudorandom numbers to the secure application 111 in the computer system 110. The secure application may include a key generator to use the pseudorandom numbers to produce a block of ciphertext or message authentication code used in the computer system. In another example, the system may include a plurality of ring oscillators 102.

Figure 2:
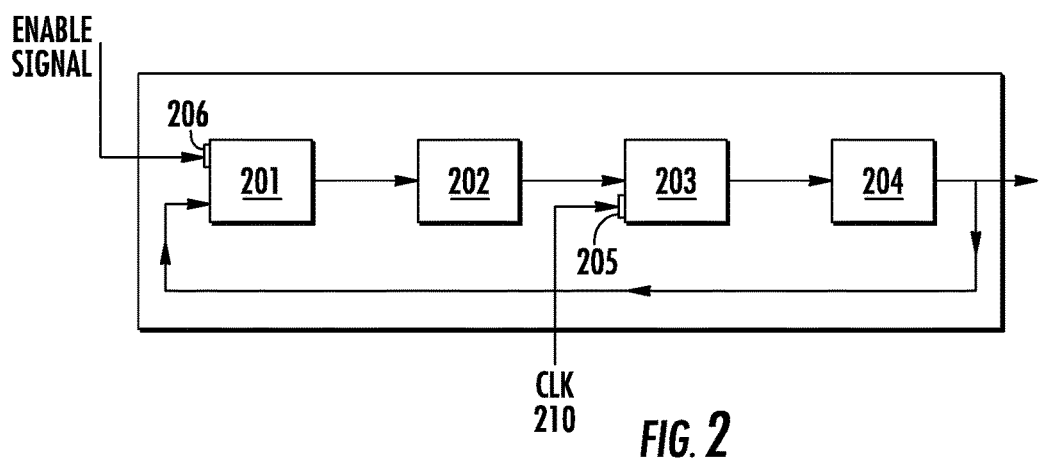
FIG. 2 illustrates a synchronizable ring oscillator, according to various example implementations.

FIG. 2 illustrates a synchronizable ring oscillator 200, according to various example implementations. In some examples, the ring oscillator 200 can be the ring oscillator 102 in the system 100. In some examples, the ring oscillator includes a plurality of logic gates connected in a ring configuration, e.g., the logic gates 201-204, as shown. In the ring configuration, an output of each except a last of the plurality of logic gates is used as an input for a next one of the plurality of logic gates. For example, as shown, the output of the logic gate 201 is used as an input for the logic gate 202, and the output of the logic gate 202 is used as an input for the logic gate 203. Also, in the ring configuration, the output of the last of the plurality of logic gates is fed back to and used as an input for a first of the plurality of logic gates. For example, the output of the last logic gate 204 is fed back to and used as an input for the first logic gate 201.

In some examples, a logic gate of the plurality of logic gates includes an enable input configured to receive an enable signal to enable the logic gate and thereby the ring oscillator. For example, the first logic gate of the ring oscillator, e.g., the logic gate 201, also has an enable input 206 to receive a ring-enable signal from the control logic 101 to start and stop the oscillation of the ring oscillator. The enable input can start or stop the oscillator, by any means known in the art, including the use of a NAND or NOR gate or a latch among the logic gates of the ring oscillator, with an input that starts or stops the oscillation. The ring-enable signal can be provided to any of the logic gates 201-204.

In some examples, the control logic 101 is configured to start the ring oscillator 200 by the ring-enable signal and a clock signal provided to a clock input of at least one controlled logic gate of the plurality of logic gates in the ring configuration. The at least one controlled logic gate is configured to receive the clock signal to control the at least one controlled logic gate and thereby synchronize the ring oscillator to the clock signal. The clock signal is provided to the clock input for a predetermined warm-up duration. After the predetermined warm-up duration, the control logic is configured to restart and operate the ring oscillator without the clock signal.

For example, as shown, the at least one controlled logic gate can be the logic gate 203. The logic gate 203 includes a clock input 205 configured to receive the clock signal 210 to control the logic gate and thereby synchronize the ring oscillator 200 to the clock signal. In another example, the at least one controlled logic gate can be a different logic gate, e.g. the logic gate 201 or 202. The control logic can start the ring oscillator by providing the ring-enable signal and the clock signal to the clock input for a predetermined warm-up duration. After the predetermined warm-up duration, the control logic can restart and operate the ring oscillator without the clock signal, e.g., by removing or disabling the clock signal.

In one example, if the clock (synchronizing) frequency of the clock signal 210 is sub-harmonic to the frequencies of many ring oscillators, all of them can be synchronized with the single clock signal. For example, ring oscillators of frequency 1.5 GHz, 1.7 GHz, 2 GHz, 2.3 GHz can all be synchronized to a 100 MHz clock signal (with 15, 17, 20 and 23 frequency multiplication).

In one example, the clock signal 210 can be narrow clock pulses. When the clock signal is at logic level 1, the clock signal can block the change of the output of the at least one controlled logic gate, e.g., the logic gate 203. On the other hand, when the clock signal is at logic level 0, the output of the controlled logic gate is not affected by the clock signal.

In one example, when the clock signal 210 at logic level 1 arrives at the input of the controlled logic gate 203, if the controlled logic gate would not switch due to the ring oscillator operation during the whole period when the clock signal is at logic level 1, the clock signal does not affect the output of the controlled logic gate. This is because if the controlled logic gate does not switch, there is no change of output to be blocked.

On the other hand, if the controlled logic gate 203 would switch due to the ring oscillator operations during the period when the clock signal 210 is at logic level 1, the corresponding change of the output of the controlled logic gate is blocked. That is, the signal going to the next logic gate, e.g., the logic gate 204, is held at the previous level. Only when the clock signal changes from logic level 1 to logic level 0, the output of the controlled logic gate is allowed to reach the next logic gate in the ring. In this way, the output of the controlled logic gate is synchronized to the falling edge (changing from logic level 1 to logic level 0) of the clock signal. In another example, the output of the controlled logic gate can be synchronized to the rising edge (changing from logic level 0 to logic level 1) of the clock signal.

In some examples, the plurality of logic gates includes an odd number of inverting logic gates connected in the ring configuration. For example, the logic gate 201 can be an inverting logic gate, e.g., an inverter. In another example, the logic gates 201, 202 and 203 can be inverting logic gates. The at least one controlled logic gate, e.g., the logic gate 203, has an enable input that is the clock input 205 configured to receive the clock signal 210. The at least one controlled logic gate may or may not be an inverting logic gate. In one example, the output and/or one or more of the inputs of the controlled logic gate can be modified from inverted to non-inverted or vice versa. The ring oscillator 200 can operate normally as long as there is an odd number of inverting logic gates in the ring oscillator.

Figure 3A:
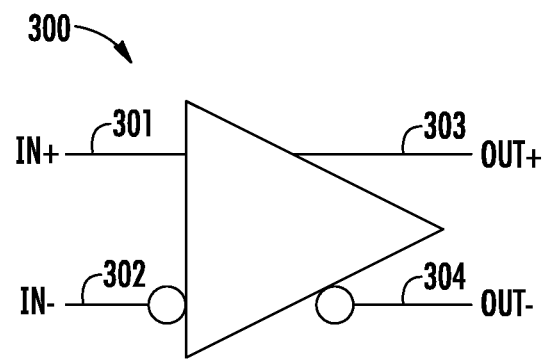
FIGS. 3A, 3B, 3C and 3D illustrate logic gates used to synchronize the ring oscillator, according to various example implementations.

In some examples, the at least one controlled logic gate, e.g., the logic gate 203, includes a differential buffer gate (as shown in FIG. 3A below) having a non-inverted input and an inverted input, and at least an inverted output. The non-inverted input is connected to an output of a previous one of the plurality of logic gates in the ring configuration, e.g., the output of the logic gate 202. The inverted input is the clock input 205. The inverted output is connected to an input for a next one of the plurality of logic gates in the ring configuration, e.g., the input of the logic gate 204.

Figure 3B:
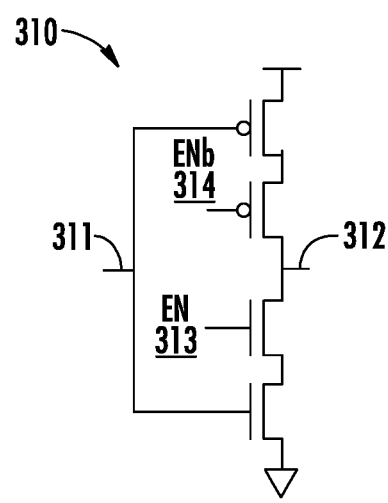

In some examples, the at least one controlled logic gate, e.g., the logic gate 203, includes a tri-state inverter (as shown in FIG. 3B below). The tri-state inverter has an input connected to an output of a previous one of the plurality of logic gates in the ring configuration. The tri-state inverter also has an inverted output connected to an input of a next one of the plurality of logic gates in the ring configuration, and a gate enable input that is the clock input 205.

Figure 3C:
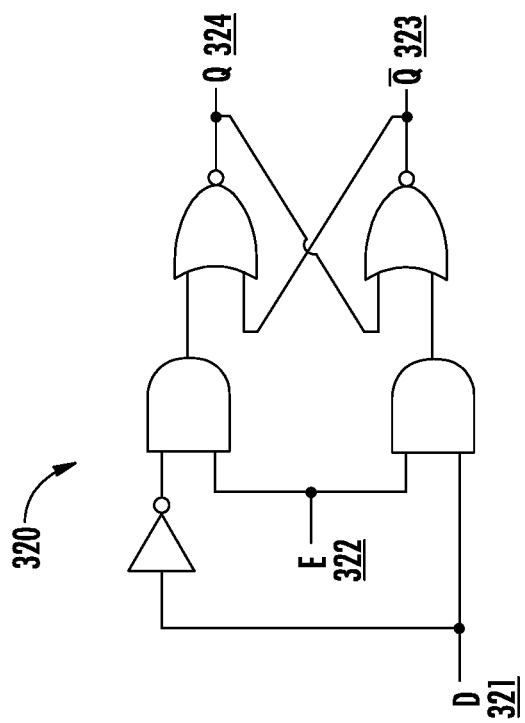

In some examples, the at least one controlled logic gate, e.g., the logic gate 203, includes a gated D-latch (as shown in FIG. 3C below). The gated D-latch has a data input and an enable input, and at least an inverted output. The data input is connected to an output of a previous one of the plurality of logic gates in the ring configuration. The enable input is the clock input 205. The inverted output is connected to an input for a next one of the plurality of logic gates in the ring configuration.

Figure 3D:
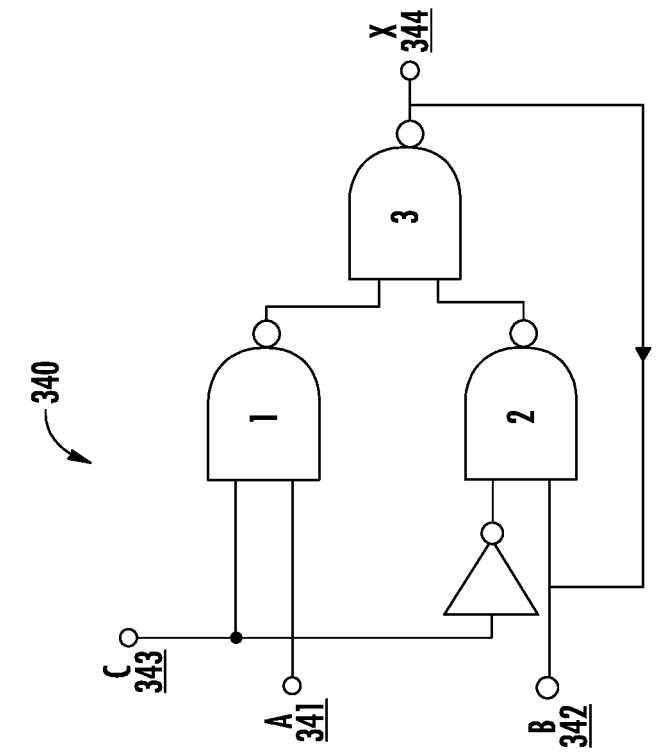
Figure 3D:
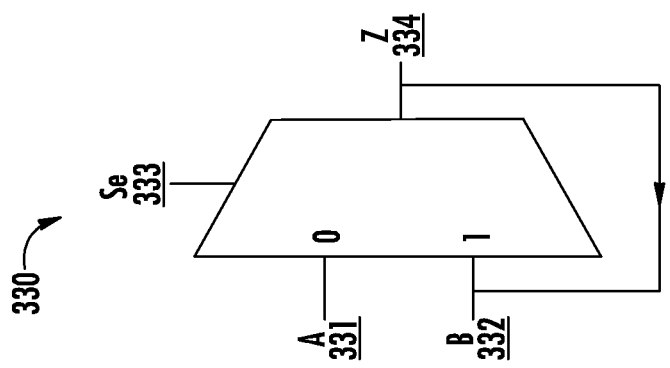

In some examples, the at least one controlled logic gate, e.g., the logic gate 203, includes a 2:1 multiplexer (as shown in FIG. 3D below) connected between consecutive logic gates of the plurality of logic gates in the ring configuration. For example, the 2:1 multiplexer can be a part of the logic gate 203 or inserted between the consecutive logic gates 203 and 204. The 2:1 multiplexer has a first input and a second input, a selector input and an output. The first input is connected to an output of an earlier one of the consecutive logic gates in the ring configuration, e.g., the output of the logic gate 203. The selector input is the clock input. The output is connected to an input for a later one of the consecutive logic gates in the ring configuration, e.g., the input of the logic gate 204. The output is also fed back and connected to the second input of the 2:1 multiplexer.

In some examples, each of the plurality of logic gates causes a gate delay in signal propagation within the ring oscillator 200. The clock signal 210 includes a periodic train of pulses having a pulse-width that is the gate delay or a multiple of the gate delay caused by the at least one controlled logic gate, e.g., the logic gate 203. In one example, if the controlled logic gate 203 is a regular inverting logic gate, the pulse-width of the clock signal can be equal to the delay of the inverting logic gate. In another example, if the controlled logic gate is a very fast inverting logic gate, the pulse-width of the clock signal can be 2 or 3 times of the delay of the very fast inverting logic gate. At synchronization there is a slight pulse width phase modulation of the oscillation signal of the ring oscillator, which is equal or less than the pulse-width of the clock signal.

In some examples, the clock signal 210 has a clock frequency, and the ring oscillator 200 is configured to oscillate at a frequency that is the clock frequency or a multiple of the clock frequency. The free running oscillation frequency of the ring oscillator is constrained by technological limits. For example, the oscillation frequency of the ring oscillator may be restricted to 1, 2, . . . , 40 times of the clock frequency of the clock signal in the 32 nm Silicon-On-Insulator (SOI) technology. Other chip manufacturing technologies may require slightly different maximum allowable oscillation frequency. In another example, if the goal is to generate a signal of a frequency coupled to the clock signal by a fixed frequency ratio in the whole range of environmental conditions, the ring oscillator may be designed at a much lower free running frequency such as at most 4 times of the clock frequency of the clock signal.

In some examples, the at least one controlled logic gate is multiple controlled logic gates each of which includes a respective clock input 205 configured to receive the clock signal 210 to control the multiple controlled logic gates and thereby synchronize the ring oscillator 200 to the clock signal. For example, multiple or all of the logic gates 201-204 can include the clock input and receive the clock signal. In one example, the clock signal needs to arrive at the multiple logic gates of the ring oscillator at the same time. To achieve this, the clock signal can be distributed to the multiple logic gates using a tree structure of buffers. In this example, there is no requirement about the delay of this tree, other than it needs to be uniform at each terminal node, i.e., at each of the multiple logic gates.

FIGS. 3A, 3B, 3C and 3D illustrate the controlled logic gate 203 used to synchronize the ring oscillator 200, according to various example implementations.

In some examples, the controlled logic gate 203 includes a differential buffer gate 300, as shown in FIG. 3A. In these examples, the differential buffer gate is an inverting logic gate. The differential buffer gate includes a non-inverted input 301 and an inverted input 302, a non-inverted output 303 and inverted output 304. The non-inverted input is connected to an output of a previous one of the plurality of logic gates in the ring, e.g., the output of the logic gate 202. The inverted input is the clock input 205 to receive the clock signal 210. The non-inverted output can be floating. The inverted output is connected to an input for a next one of the plurality of logic gates, e.g., the input of the logic gate 204. In another example, the differential buffer gate does not have the non-inverted output.

In one example, if the clock signal 210 received at the inverted input 302 is at logic level 1 or close to the supply voltage, the next logic gate 204 does not react to any changes on the inverted output 304 of the differential buffer gate 300. If the clock signal received at the inverted input is at logic level 0 or at a voltage level close to the ground, the ring oscillator 200 functions normally. Accordingly, connecting the inverted input of the differential buffer gate to the clock signal of short pulses synchronizes the ring oscillator to the falling edges of the clock signal. In this example, an extra synchronizing delay is introduced at one or more logic gates (possibly not the controlled logic gate) which would switch closest to the clock pulse. Other logic gates of the ring oscillator may not be affected.

In some examples, the controlled logic gate 203 includes a tri-state inverter 310, as shown in FIG. 3B. In these examples, the tri-state inverter includes an input 311 connected to an output of a previous one of the plurality of logic gates in the ring, e.g., the output of the logic gate 202. The tri-state inverter also includes an inverted output 312 connected to an input of a next one of the plurality of logic gates, e.g., the input of the logic gate 204. The tri-state inverter further includes a gate enable input 313 that is the clock input 205 to receive the clock signal 210. The received clock signal can be inverted to get the signal ENb 314 to drive the tri-state inverter.

In one example, when the received clock signal 210 is at logic level 1, the ENb 314 is at logic level 0, the inverted output 312 is at high impedance and in a floating state. In this case, if the clock signal includes a pulse that is short enough, the input capacitance of the next logic gate 204 has no time to discharge, therefore the next logic gate retains its previous on/off state. On the other hand, when the received clock signal is at logic level 0, the ENb is at logic level 1, the tri-state inverter behaves like a regular inverter. In this case, the inverted output is connected directly to the input of the next logic gate. Accordingly, connecting the gate enable input 313 of the tri-state inverter 310 to the clock signal of short pulses synchronizes the ring oscillator 200 to the falling edges of the clock signal. In this example, an extra synchronizing delay is introduced at one or more logic gates (possibly not the controlled logic gate) which would switch closest to the clock pulse. Other logic gates of the ring oscillator may not be affected.

In some examples, the controlled logic gate 203 includes a gated D-latch 320, as shown in FIG. 3C. In these examples, the gated D-latch is an inverting logic gate. The gated D-latch includes a data input 321 and an enable input 322, an inverted output 323 and a non-inverted output 324. The data input is connected to an output of a previous one of the plurality of logic gates in the ring, the output of the logic gate 202. The enable input is the clock input 205 to receive the clock signal 210. The inverted output is connected to an input for a next one of the plurality of logic gates in the ring, e.g., the input of the logic gate 204. The non-inverted output can be floating.

In one example, as shown in table 325, when the enable input 322 (E) is at logic level 0, the inverted output 323 ($\overline{Q}$) is latched and does not react to any changes on the data input 321 (D). On the other hand, when the enable input (E) is at logic level 1, the inverted output $\overline{Q}$ has the inverted value of the data input (D), like a regular inverter. Accordingly, connecting the enable input of the gated D-latch 320 to the clock signal of short pulses synchronizes the ring oscillator 200 to the rising edges of the clock signal. In this example, the gated D-latch can replace the regular inverter in the ring oscillator. The gated D-latch has the advantage that it has been optimized to get metastable rarely, therefore it produces cleaner frequency spectra.

In some examples, the controlled logic gate 203 includes a 2:1 multiplexer 330 or 340, as shown in FIG. 3D. The 2:1 multiplexer is connected between consecutive logic gates of the plurality of logic gates in the ring. For example, the 2:1 multiplexer can be a part of the logic gate 203 or inserted between the consecutive logic gates 203 and 204. The 2:1 multiplexer 330 has a first input 331 and a second input 332, a selector input 333 and an output 334. The first input is connected to an output of an earlier one of the consecutive logic gates in the ring, e.g., the output of the logic gate 203. The selector input is the clock input 205. The output is connected to an input for a later one of the consecutive logic gates in the ring, e.g., the input of the logic gate 204. The output is also fed back and connected to the second input of the 2:1 multiplexer.

The 2:1 multiplexer can be implemented as shown in 340. It has a first input 341 and a second input 342, a selector input 343 and an output 344. The first input, second input, selector input and output can be arranged similarly as the 2:1 multiplexer 330.

In one example, for the 2:1 multiplexer 330, when the selector input 333 is at logic level 1, the 2:1 multiplexer becomes a latch and the output 334 is the same as the second input 332. In this case, the current level of the output is kept and the effects of any changes on the first input 331 are blocked. On the other hand, when the selector input is at logic level 0, the first input is allowed to propagate to the output at a delay of at most the width of the clock pulse. That is, the ring oscillator 200 works normally. Accordingly, connecting the selector input of the 2:1 multiplexer 330 to the clock signal of short pulses synchronizes the ring oscillator 200 to the falling edges of the clock signal. The 2:1 multiplexer 340 can be used to synchronize the ring oscillator to the falling edges of the clock signal similarly.

The differential buffer gate 300, tri-state inverter 310, gated D-latch 320 or 2:1 multiplexer 330 or 340 used in the synchronizable ring oscillator 200 may be available in standard component libraries of integrated circuit manufacturing processes. Thus, in contrast to the existing solutions, using the synchronizable ring oscillator to stabilize the startup behavior of the ring oscillator 200 has low cost and can provide predictable startup conditions.

In one example, at 32 nm or smaller feature sizes of integrated circuits, certain gates slow down, and other gates speed up with temperature. At certain temperatures the trends may reverse. The behavior of a gate is unpredictable depending on manufacturing variations. When a ring oscillator starts to oscillate, it warms up, which may cause faster oscillation and further speed up until an equilibrium is reached. The rate of the temperature changes and variations in the environmental conditions lead to different stable oscillation frequencies, which cause problems in the system using the ring oscillator. That is, the ring oscillator may get into untested modes of unknown rates of entropy generation.

In one example, the temperature stabilization cannot be achieved by simply running a ring oscillator for a short time until the local temperature around the ring oscillator reaches a stable value. By running the ring oscillator for a while, the circuit does achieve stable temperatures, but these temperature values can be one of several different and unpredictable values. The reason is that there are many stable points (equilibria), with different oscillation frequencies and different local temperatures. For example, certain ring oscillators may have more than 5 different stable oscillation frequencies.

In one example, a number of different temperature control approaches are possible. For example, a heating element can be built directly next to the ring oscillator. The heater can generate a known and controllable amount of heat, e.g., by switching many gates synchronously to the system's clock frequency, and by stopping when the ring oscillator get started. The heating gates could be arranged in chains to ensure tiny delays in their switching points. Also, switching a restive load on and off as needed can be another solution, but this solution needs an analog component such as a large size (distributed) resistor, which is not available in standard integrated circuit component libraries.

In one example, in an integrated circuit system, when the local temperature of the oscillator circuit on the die changes rapidly, the effects of the circuit noise are masked by this stronger influence. So the phase drift of a ring oscillator becomes predictable. At startup the ring oscillator generates some heat, and the local temperature of the oscillator circuit increases above the die temperature of integrated circuits. This temperature change causes large variations in the oscillation frequency. The temperature change is mostly independent of the circuit noise.

Another problem is that the ring oscillator can start up at one of several stable frequencies. The generated entropy (physical randomness) depends on the unpredictable frequencies, which are the result of the variations of local heat-up patterns. The manufacturing uncertainties make each ring oscillator different, and so the set of startup frequencies cannot be predicted. The unpredictable frequencies can only be measured by long and expensive characterization of the individual integrated circuits. The unpredictable startup problem cannot be remedied by starting up the ring oscillators and only collect entropy after a predetermined warm-up period, because any ring circuit could warm-up to one of several unpredictable temperatures corresponding to the various stable oscillating frequencies of the ring oscillator.

Also, the longer the ring oscillator runs, the more information leaks on side channels (e.g., EM emanations, capacitive or inductive coupling, fluctuation of power use, noise on output pins). The leaked information about the oscillation signal allows an unauthorized third party to model its behavior, and predict the phase drift behavior. If the attack succeeds, the secrecy of the random numbers (and of derived cryptographic keys) may be lost.

In one example, using the ring oscillator 200 disclosed in this disclosure can generate known and controllable amount of heat, and so can provide predictable circuit temperatures. To avoid the problem of unpredictable oscillation frequencies while in heating mode, the ring oscillator 200 is synchronized to a stable clock signal 210. The control logic 101 is configured to start up the ring oscillator 200 synchronous to a stable clock signal 210. Since the frequency is now fixed, the generated heat is also fixed. Ensuring enough time for the ring oscillator to stabilize after a predetermined fixed time such as 1 µs, the clock signal is removed. At this point, the local temperature of the circuit in the system 100 is stable. Also, the circuit noise, not the fast temperature changes, will influence the phase drift of the ring oscillator. Further, the free running ring oscillator will produce true randomness in the values using its pulse counter. Moreover, the side channel leakage about the free running oscillation is kept at a minimum, because the now stable oscillation allows shorter operation periods.

In another example, a ring based physical unclonable function (PUF) device can include multiple ring oscillators. The PUF device can produce a chip-ID or a component of a root key used in the computer system 110 by performing frequency comparisons between pairs of the multiple ring oscillators. The main problem with the PUF device is that the multiple ring oscillators start up at one of several stable but unpredictable frequencies. The frequency comparisons on the unpredictable frequencies may not be reliable, thus the PUF value can become random.

The above unpredictable startup problem in the PUF device cannot be remedied by starting up the ring oscillators and only collect entropy after a warm-up period, because the ring circuit will warm-up to one of several unpredictable temperatures corresponding to the random startup frequencies. Also, the longer the ring oscillator runs, the more information it leaks on side channels (e.g., EM emanations, capacitive or inductive coupling, fluctuation of power use, noise on output pins). The leaked information about the oscillation signal allows an unauthorized third party to map the frequencies, and with targeted attacks on individual ring oscillators the attack can discover the PUF value. With a successful attack, the secrecy of the PUF value (and of the derived cryptographic root key) may be lost.

In one example, using the ring oscillator 200 disclosed in this disclosure can generate known and controllable amount of heat, and so can provide predictable circuit temperatures. To avoid the problem of unpredictable oscillation frequencies while in heating mode, the PUF device can include multiple ring oscillators 200 that are synchronized to a stable clock signal 210. The control logic 101 is configured to start the ring oscillators in the PUF device and the ring oscillators are synchronized to the stable clock frequency of the clock signal 210. When the ring oscillators are stabilized after a predetermined fixed time such as 1 µs, the synchronization of the ring oscillators is stopped, e.g. by stopping the clock signal. At this point, for the PUF device, the local temperatures of the ring oscillator circuits are stable and manufacturing differences yield reliable frequency relations between pairs of ring oscillators. Also, the free running ring oscillators will produce steady differences in their associated pulse counters, when running a predetermined fixed time duration. Moreover, the side channel leakage about the free running oscillation is kept to a minimum by shorter unsynchronized running times than in the case that the unstable warm-up periods are included in the pulse counting.

Figure 4A:
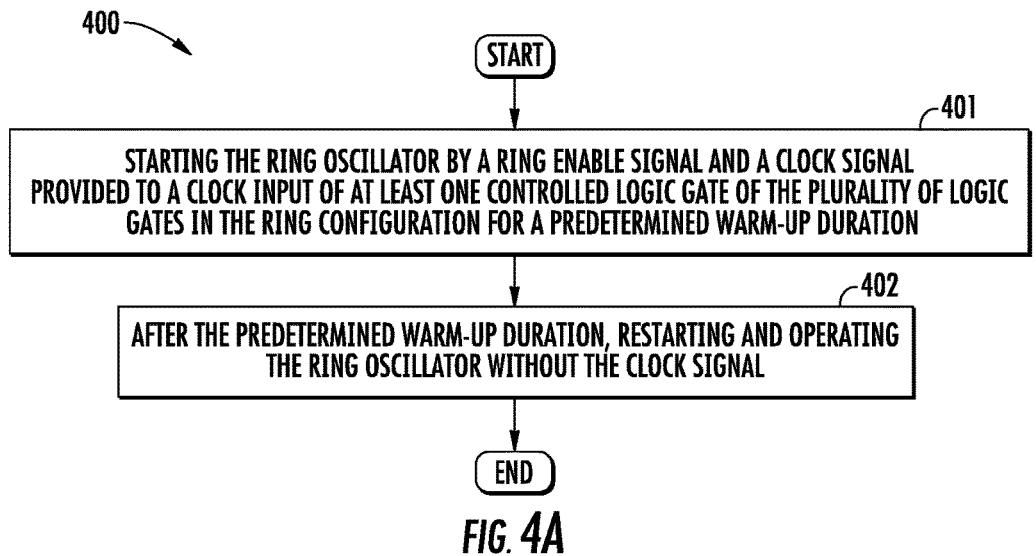
FIGS. 4A and 4B are flowcharts illustrating various steps in a method of operating a ring oscillator according to various example implementations.

FIG. 4A is a flowchart illustrating various steps in a method 400 of operating the ring oscillator 200 (i.e., the ring oscillator 102), according to various example implementations. At block 401, the method includes starting the ring oscillator by a ring-enable signal and a clock signal 210 provided to a clock input 205 of at least one controlled logic gate 203 of the plurality of logic gates 201-204 in the ring configuration for a predetermined warm-up duration. The at least one controlled logic gate receives the clock signal to control the at least one controlled logic gate and thereby synchronize the ring oscillator to the clock signal. At block 402, the method includes, after the predetermined warm-up duration, restarting and operating the ring oscillator without the clock signal.

Figure 4B:
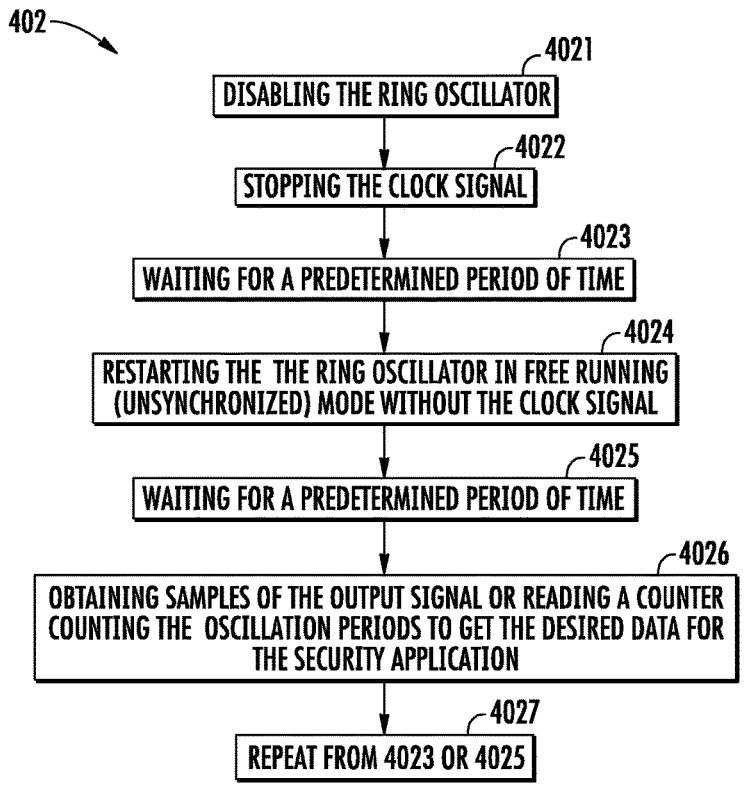

In some examples, the method 400 may include multiple steps at block 402 for security application as shown in FIG. 4B. At block 4021, the method includes disabling the ring oscillator 200 by removing the enable signal 206. At block 4022, the method includes stopping or removing the clock signal 210. At block 4023, the method includes waiting for a predetermined period of time. At block 4024, the method includes restarting the ring oscillator in free running (unsynchronized) mode without the clock signal. At block 4025, the method includes waiting for a predetermined period of time. At block 4026, the method includes obtaining samples of the output signal or reading a counter counting the oscillation periods to get the desired data (e.g., true random numbers) for the security application. After block 4026, the method can repeat from block 4023 or 4025 as desired.

Many modifications and other implementations of the disclosure set forth herein will come to mind to one skilled in the art to which the disclosure pertains having the benefit of the teachings presented in the foregoing description and the associated drawings. Therefore, it is to be understood that the disclosure is not to be limited to the specific implementations disclosed and that modifications and other implementations are intended to be included within the scope of the appended claims. Moreover, although the foregoing description and the associated drawings describe example implementations in the context of certain example combinations of elements and/or functions, it should be appreciated that different combinations of elements and/or functions may be provided by alternative implementations without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

What is claimed is:

1. A method of operating a ring oscillator, the ring oscillator comprising a plurality of logic gates connected in a ring configuration in which an output of each of the plurality of logic gates is used as an input for a next one of the plurality of logic gates, the output of the last of the plurality of logic gates being fed back to and used as an input for a first of the plurality of logic gates, the method comprising:

starting the ring oscillator by a ring-enable signal and a clock signal provided to a clock input of at least one controlled logic gate of the plurality of logic gates in the ring configuration, the at least one controlled logic gate receiving the clock signal to control the at least one controlled logic gate and thereby synchronize the ring oscillator to the clock signal, the clock signal being provided to the clock input for a predetermined warm-up duration, wherein each of the plurality of logic gates causes a gate delay in signal propagation within the ring oscillator, and starting the ring oscillator includes starting the ring oscillator by the ring-enable signal and the clock signal that includes a periodic train of pulses having a pulse-width that is the gate delay or an integer multiple of the gate delay; and thereafter, restarting and operating the ring oscillator without the clock signal.

2. The method of claim 1, wherein the plurality of logic gates includes an odd number of inverting logic gates connected in the ring configuration, and
wherein the at least one controlled logic gate has a synchronizing input that is the clock input to which the clock signal is provided.

3. The method of claim 1, wherein the at least one controlled logic gate includes a differential buffer gate having a non-inverted input and an inverted input, and at least an inverted output, the non-inverted input being connected to an output of a previous one of the plurality of logic gates in the ring configuration, the inverted input being the clock input, the inverted output being connected to an input for a next one of the plurality of logic gates in the ring configuration, and
wherein starting the ring oscillator includes starting the ring oscillator by the ring-enable signal and the clock signal provided to the inverted input of the differential buffer gate.

4. The method of claim 1, wherein the at least one controlled logic gate includes a tri-state inverter having an input connected to an output of a previous one of the plurality of logic gates in the ring configuration, an inverted output connected to an input of a next one of the inverting logic gates in the ring configuration, and a gate enable input that is the clock input, and
wherein starting the ring oscillator includes starting the ring oscillator by the ring-enable signal and the clock signal provided to the enable input of the tri-state inverter.

5. The method of claim 1, wherein the at least one controlled logic gate includes a gated D-latch having a data input and an enable input, and at least an inverted output, the data input being connected to an output of a previous one of the plurality of logic gates in the ring configuration, the enable input being the clock input, and the inverted output being connected to an input for a next one of the plurality of logic gates in the ring configuration, and
wherein starting the ring oscillator includes starting the ring oscillator by the ring-enable signal and the clock signal provided to the enable input of the gated D-latch.

6. The method of claim 1, wherein the at least one controlled logic gate includes a 2:1 multiplexer connected between consecutive logic gates of the plurality of logic gates in the ring configuration, the 2:1 multiplexer having a first input and a second input, a selector input and an output, the first input being connected to an output of an earlier one of the consecutive logic gates in the ring configuration, the selector input being the clock input, and the output being both connected to an input for a later one of the consecutive logic gates in the ring configuration, and fed back and connected to the second input of the 2:1 multiplexer, and
wherein starting the ring oscillator includes starting the ring oscillator by the ring-enable signal and the clock signal provided to the selector input of the 2:1 multiplexer.

7. The method of claim 1, wherein the clock signal has a clock frequency, and restarting and operating the ring oscillator includes restarting and operating the ring oscillator at a frequency that is the clock frequency or a multiple of the clock frequency.

8. The method of claim 1, wherein the at least one controlled logic gate is multiple controlled logic gates each of which includes a respective clock input that receives the clock signal to control the multiple controlled logic gates and thereby synchronize the ring oscillator to the clock signal.

9. A system for providing security in a computer system, the system comprising a ring oscillator, the ring oscillator comprising a plurality of logic gates connected in a ring configuration in which an output of each of the plurality of logic gates is used as an input for a next one of the plurality of logic gates, the output of the last of the plurality of logic gates being fed back to and used as an input for a first of the plurality of logic gates, the system also comprising one or more logic circuits configured to at least:
start the ring oscillator by a ring-enable signal and a clock signal provided to a clock input of at least one controlled logic gate of the plurality of logic gates in the ring configuration, the at least one controlled logic gate receiving the clock signal to control the at least one controlled logic gate and thereby synchronize the ring oscillator to the clock signal, the clock signal being provided to the clock input for a predetermined warm-up duration, wherein each of the plurality of logic gates causes a gate delay in signal propagation within the ring oscillator, and the one or more logic circuits being configured to start the ring oscillator includes being configured to start the ring oscillator by the ring-enable signal and the clock signal that includes a periodic train of pulses having a pulse-width that is the gate delay or an integer multiple of the gate delay; and thereafter,
restart and operate the ring oscillator without the clock signal.

10. The system of claim 9, wherein the plurality of logic gates includes an odd number of inverting logic gates connected in the ring configuration, and wherein the at least one controlled logic gate has a synchronizing input that is the clock input to which the clock signal is provided.

11. The system of claim 9, wherein the at least one controlled logic gate includes a differential buffer gate having a non-inverted input and an inverted input, and at least an inverted output, the non-inverted input being connected to an output of a previous one of the plurality of logic gates in the ring configuration, the inverted input being the clock input, the inverted output being connected to an input for a next one of the plurality of logic gates in the ring configuration, and
wherein the one or more logic circuits being configured to start the ring oscillator includes being configured to start the ring oscillator by the ring-enable signal and with the clock signal provided to the inverted input of the differential buffer gate.

12. The system of claim 9, wherein the at least one controlled logic gate includes a tri-state inverter having an input connected to an output of a previous one of the plurality of logic gates in the ring configuration, an inverted output connected to an input of a next one of the inverting logic gates in the ring configuration, and a gate enable input that is the clock input, and wherein the one or more logic circuits being configured to start the ring oscillator includes being configured to start the ring oscillator by the ring-enable signal and with the clock signal provided to the enable input of the tri-state inverter.

13. The system of claim 9, wherein the at least one controlled logic gate includes a gated D-latch having a data input and an enable input, and at least an inverted output, the data input being connected to an output of a previous one of the plurality of logic gates in the ring configuration, the enable input being the clock input, and the inverted output being connected to an input for a next one of the plurality of logic gates in the ring configuration, and wherein the one or more logic circuits being configured to start the ring oscillator includes being configured to start the ring oscillator by the ring-enable signal and the clock signal provided to the enable input of the gated D-latch.

14. The system of claim 9, wherein the at least one controlled logic gate includes a 2:1 multiplexer connected between consecutive logic gates of the plurality of logic gates in the ring configuration, the 2:1 multiplexer having a first input and a second input, a selector input and an output, the first input being connected to an output of an earlier one of the consecutive logic gates in the ring configuration, the selector input being the clock input, and the output being both connected to an input for a later one of the consecutive logic gates in the ring configuration, and fed back and connected to the second input of the 2:1 multiplexer, and wherein the one or more logic circuits being configured to start the ring oscillator includes being configured to start the ring oscillator by the ring-enable signal and the clock signal provided to the selector input of the 2:1 multiplexer.

15. The system of claim 9, wherein the clock signal has a clock frequency, and the one or more logic circuits being configured to restart and operate the ring oscillator includes being configured to restart and operate the ring oscillator at a frequency that is the clock frequency or a multiple of the clock frequency.

16. The system of claim 9, wherein the at least one controlled logic gate is multiple controlled logic gates each of which includes a respective clock input configured to receive the clock signal to control the multiple controlled logic gates and thereby synchronize the ring oscillator to the clock signal.

\* \* \* \* \*